(12) United States Patent
Vallance et al.

(10) Patent No.: US 6,660,959 B2
(45) Date of Patent: Dec. 9, 2003

(54) PROCESSES FOR NANOMACHINING USING CARBON NANOTUBES

(75) Inventors: Robert Ryan Vallance, Lexington, KY (US); Apparao M. Rao, Anderson, SC (US); M. Pinar Menguc, Lexington, KY (US)

(73) Assignee: University of Kentucky Research Foundation, Lexington, KY (US)

( * ) Notice: Subject to any disclaimer, the term of this patent is extended or adjusted under 35 U.S.C. 154(b) by 0 days.

(21) Appl. No.: 10/301,053

(22) Filed: Nov. 21, 2002

(65) Prior Publication Data

US 2003/0173338 A1 Sep. 18, 2003

Related U.S. Application Data

(60) Provisional application No. 60/332,088, filed on Nov. 21, 2001.

(51) Int. Cl.$^7$ .............................................. B23K 15/00
(52) U.S. Cl. ................................................ 219/121.18
(58) Field of Search ..................... 219/121.12, 121.18, 219/121.19, 121.2, 121.21, 121.35

(56) References Cited

U.S. PATENT DOCUMENTS 3,866,077 A * 2/1975 Baker et al.
6,339,281 B2 * 1/2002 Lee et al.

OTHER PUBLICATIONS

Bonard, Jean–Marc et al. Field Emission from carbon nanotubes: the first five years. Solid–State Electronics 45 (2001) 893–914.
Y. Saito. Field Emission from multi–walled carbon nanotubes and its application to electron tubes. Applied Physics A . 67–95–100. 1998.
Bonard, Jean–Marc et al. Field emission from single–wall carbon nanotube films. Applied physics letters. Vol. 73, No. 7. Aug. 1998.
Hirakawa et al. Electron emmission properties of carbon nanotubes. Applied Surface Science. 169–170 (2001) 662–665.
Bonard, J–M et al. Field Emission from Carbon Nanotubes: perspectives for applications and clues to the emission . . . Applied Physics A. 1999 245–254.
Saito et al. Field emission from carbon nanotubes and its application to electron sources. Carbon 38 (2000) 169–182.
De Heer, Walt et al. A carbon nanotube field–emission electron source. Science. Nov. 17, 1995, p1179.
Collins, Phillip G. et al. A simple and robust electron beam source from carbon nanotubes. Applied Physics letters 69 (13) Sep. 23, 1996.
Ren, Z. F. et al. Synthesis of large arrays of well–aligned carbon nanotubes on glass. www.sciencemag.org. Science Vol. 282 Nov. 6, 1998.

(List continued on next page.)

*Primary Examiner*—Samuel M. Heinrich
(74) *Attorney, Agent, or Firm*—King & Schickli, PLLC (57) ABSTRACT

Novel methods and devices for nanomachining a desired pattern on a surface of a conductive workpiece are disclosed. In one aspect, the method comprises using an electron beam emitted from one or more nanotubes to evaporate nanoscale quantities of material from the workpiece surface. The surface of the workpiece to be machined may be excited to a threshold energy to reduce the amount of power required to be emitted by the nanotube. In another aspect, a device is described for nanomachining a desired pattern on a surface of a conductive workpiece, comprising a vessel capable of sustaining a vacuum, a leveling support, a nanopositioning stage, and a laser for heating the workpiece. A nanotool is provided comprising at least one nanotube supported on an electrically conductive base, adapted to emit an electron beam for evaporating material from an electrically conductive workpiece.

50 Claims, 6 Drawing Sheets

OTHER PUBLICATIONS

Cao Anyuan et al. Vertical aligned carbon nanotubes grown on Au film and reduction of threshold . . . Chemical Physics letters 335 (2001) 150–154.

Pan, Z.W. et al. Very low–field emission from aligned and opened carbon nanotube arrays. J. Phy. Chem B 2001 1519–1522.

Choi, K.H. Controlled deposition of carbon nanotubes on patterned substrate. Surface Science 462 (2000) 195–202.

Wei Y Y et al. Direct fabrication of carbon nanotube circuits by selective area chemical vapour . . . Nanotechnology II (2000) 61–64.

Ago, Hiroki et al. Dispersion of metal nanoparticles for aligned carbon nanotube arrays. Applied Physics letters. Vol. 77, No. 1. Jul. 3, 2000.

Teo, K.B.K et al. Uniform patterned growth of carbon nanotubes without surface . . . Applied Physics letters. Vol. 79, No. 10. Sep. 3, 2001.

Merkulov, V.I. et al. Patterned growth of individual and multiple vertically aligned carbon . . . Applied Physics letters. Vol 76, No. 24, Jun. 12, 2000.

Fan, Shoushan et al. Self–Oriented regular arrays of carbon nanotubes and their field emission properties. www.sciencemag.org. Science. Jan. 22, 1999.

Notargiacomo, A. et al. Atomic force microscopy lithography as a nanodevice . . . Nanotechnology 10(1999) 458–463.

Dryakhlushin, VF et al. development of contact scanning probe lithography methods for the fabrication . . . Nanotechnology 11 (2000) 188–191.

Sheehan, Paul E. et al. Nanomachining, manipulation and fabrication by force microscopy. Nanotechnology 7.(1996) 236–240.

Lee Jin, Cheol et al. Growth and field electron emission of vertically aligned multiwalled carbon nanotubes. Chemical Physics letters 326 (2000) 175–180.

Fang, Te–Hua. Three–dimensional molecular dynamics analysis of processing using a pin tool on the atomic scale. Nanotechnology 11 (2000) 148–153.

Dzegilenko, Fedor N. Nanoscale etching and indentation of a silicon (001) surface with carbon nanotube tips. Nanotechnology 10. 1999. 253–257.

Sugimura, Hiroyuki. AFM lithography in constant current mode. Nanotechnology 8 (1997) A15–A18.

Ramsey, Stevens MD et al. Carbon nanotubes as probes for atomic force microscopy. nanotechnology 11 (2000) 1–5.

Wang, Q.H. et al. Field emission from nanotube bundle emitters at low fields. Applied physics letters 70 (24) Jun. 16, 1997.

Chung, Suk Jae et al. Field emission from carbon nanotubes grown layer–by–layer deposition method using . . . Thin Solid Films 383 (2001) 73–77.

Shimizu, Tetsuo et al. Stable atomic imaging of Si (111)–7×7 surface by scanning tunneling microscope . . . Surface Science 486 (2001) L455–L460.

* cited by examiner

PROCESSES FOR NANOMACHINING USING CARBON NANOTUBES

This application claims the benefit of U.S. Provisional Patent Application Ser. No. 60/332,088, filed Nov. 21, 2001.

TECHNICAL FIELD

The present invention relates generally to new manufacturing processes for machining (i.e. removing material) at the nano-scale. The invention specifically relates to methods and devices for machining a workpiece at the nanoscale level using carbon nanotubes as the machining tool.

BACKGROUND OF THE INVENTION

Conventional machining and micro/nano fabrication processes transfer energy into small spatial regions to remove material from a workpiece. For instance, traditional cutting with a lathe transfers energy from a tool to a workpiece through the cutting edge of the tool and focused ion beam machining transfers energy to a workpiece with a narrow beam of ions that strike the workpiece's surface. To achieve nanoscale machining, which is the removal of material near the atomic scale (1 nm–100 nm), energy must be concentrated spatially with nearly atomic resolution and also sufficient to break bonds in crystal lattices. If the energy is too excessive, then nearby atoms will also be effected and nanoscale resolution cannot be attained. Therefore, to achieve nanoscale machining, energy should be within specific limits and spatially controlled to attain patterns.

Current micromachining processes can be categorized as either parallel techniques, which simultaneously remove material from a workpiece at many locations, or serial techniques, which sequentially remove material from a single location. Common parallel techniques include surface micromachining, bulk micromachining, and laser micromachining. Common serial techniques include mechanical cutting, micro electro discharge machining (EDM), electron beam machining, ion beam machining, and laser beam machining. Parallel techniques are well suited to economically fabricating parts with 2-D geometry in batches. Serial techniques are more suitable for complex 3-D micromachining, but cannot be used for fabricating batches of parts.

Both parallel and serial micromachining techniques require a shape-generation mechanism. In parallel techniques, the shape-generating mechanism is usually a mask used during lithography. In e-beam, ion-beam, and laser micromachining, the shape-generating mechanism is the column and tip of the energy beam. In micro EDM, the electrode is the shape-generating mechanism. The physical processes that produce the shape-generating mechanism limit the resolution and size of the geometry that can be machined. Most micromachining processes are limited to feature sizes and resolution exceeding 1 $\mu$m. For instance, electrodes for micro EDM are commonly manufactured using wire electro discharge grinding (WEDG). WEDG can produce cylindrical electrodes with diameters down to about 5 $\mu$m. Consequently, the minimum feature-size producible with micro EDM is also on the order of 5 $\mu$m.

Because of the limits in current micro- and nanomachining processes, there is a need in the art for an entirely new approach for nano-machining desired workpieces. The present invention relates to a nanotool with nanostructures less than 100 nm in size, and to methods of using the nanotool to remove material from a workpiece in desired two-dimensional (2D) and three-dimensional (3D) patterns.

Nanotubes, which are carbon structures with diameters varying from 2 nm to 100 nm and lengths up to several microns, are used for shape generation and machining due to their unique physical properties for nano-machining via electrical discharges or electron emission. The present invention employs electron beams emitted from carbon nanotubes as a source of energy with nanoscale resolution and manufactures patterns by either using a predetermined pattern of nanotubes, or by relative motion between the workpiece and nanotubes.

The natural size of nanotubes and the inherent precision in their fabrication processes enable the manufacture of nano-scale tools for both serial and parallel nano-machining. For serial nano-machining, a single nanotube may be grown on an electrode. For parallel nano-machining, a 2D pattern of nanotubes may be grown on a conductive electrode substrate. The methods and devices of the present invention enable nano-machining by improving resolution and reducing minimum machined feature sizes by two to three orders of magnitude in comparison to conventional micro- and nano-machining technologies.

SUMMARY OF THE INVENTION

In accordance with the purposes of the present invention as described herein, in one aspect the present invention provides a method for machining a nanometer-scale pattern on a surface of an electrically conductive workpiece, comprising the steps of placing a nanotool in substantial proximity to the conductive workpiece surface, creating an electrical potential difference between the nanotool and the workpiece surface to cause an electron beam to emit from the nanotool and strike the conductive workpiece surface, resulting in evaporation of nanoscale quantities of material from the workpiece surface, and applying a vacuum to remove evaporated material from the workpiece surface. The electric field potential established to cause the electron beam to emit from the nanotool will typically be at least 1 V/$\mu$m. The nanotool may comprise at least one nanotube supported on an electrically conductive base. The method of the present invention may include the further step of exciting the workpiece to a threshold energy prior to contacting the workpiece with the electron beam to evaporate material therefrom.

In one embodiment of the method of the present invention, the workpiece or the nanotool may be moved relative to one another to remove material from the workpiece in accordance with a predetermined pattern. The nanotool may comprise a single nanotube supported by an electrically conductive base, or may comprise a plurality of substantially aligned nanotubes supported on the base. The plurality of nanotubes may be confined to one or more patterned regions of the electrically conductive base. It will be appreciated that for some applications this feature obviates the need to move either workpiece or nanotool relative to one another to machine the corresponding pattern into the workpiece.

Nanotubes suitable for the present invention include carbon nanotubes. However, it will be appreciated that any substance capable of forming a nanotube for emitting an electron beam in response to an electrical field may be used, such as tungsten, nickel, and the like. The nanotubes of the present invention may be single-walled or multi-walled nanotubes, and typically have a diameter of from about 1 to about 100 nanometers.

The nanotool conductive base may be fabricated from any suitably electrically conductive metal or polymer, including but not limited to materials selected from the group consisting of silicon nitride, titanium nitride, tungsten carbide, tantalum nitride, porous silicon, nickel, cobalt, gold, aluminum, polycrystalline diamond, and any combination thereof.

The conductive workpiece may be fabricated from any suitably conductive metal or polymer, and may be selected from materials including, but not limited to, the group consisting of aluminum, copper, silver, gold, polymethylmethacrylate, and any combination thereof. The workpiece may be deposited as a thin film on a substrate, with the thin film having a depth of up to 5 microns. The workpiece substrate may be fabricated from any material which is substantially transparent to a laser beam. It will be appreciated that this feature allows use of a laser to heat the workpiece from a first surface, while the nanotool of the invention is used to remove material from the obverse surface of the workpiece. The substrate may be fabricated from materials selected from the group consisting of, but not limited to, single-crystal quartz, amorphous quartz, silicon, and any combination thereof.

Excitation of the workpiece to a threshold energy may be achieved by heating. The workpiece may be heated by localized heating, by radiative heating, by conductive heating, by resistive heating, or any combination thereof. In one embodiment of the method of the present invention, localized heating may be provided by targeting a laser beam to an area substantially corresponding to the pattern to be machined. Targeting of the laser beam may be accomplished by narrowly restricting the beam width, or by masking the workpiece such that only an area corresponding to the desired pattern to be machined is exposed to the laser beam. Such masking substances and methods are known in the art. Any suitable continuous wave laser providing a light beam having a wavelength of from about 0.3 $\mu$m to about 0.7 $\mu$m may be used for localized heating of the workpiece. Examples include, but should not be limited to, argon lasers, HeCd lasers, or HeNe lasers.

To generate the nanotool electron beam for evaporation of material from the workpiece, an electrical potential of from about 500 V to about 5 kV may be applied to the nanotool. A vacuum of up to $10^{-5}$ torr may be applied to the nanotool and the workpiece to remove evaporated material. This step allows withdrawal of material removed from the surface of the workpiece by the nanotool using the applied vacuum pressure. Accordingly, no additional removal means (such as an inert sweep gas) is required.

In another aspect of the present invention, a device for machining a nanometer-scale pattern on a surface of an electrically conductive workpiece is provided, comprising a vessel having a top, a bottom, and at least one side wall defining an interior chamber to which a vacuum of up to $10^{-5}$ torr may be applied. In the interior chamber, an apparatus is placed, the apparatus comprising a first support for holding a conductive workpiece, and a second support for holding a nanotool as described above in relative proximity to the conductive workpieces. An electrical source is provided for applying an electrical current to the nanotool. The electrical source of the present device may be any electrical source capable of creating an electrical potential difference of at least 1 V/$\mu$m between the nanotool and the workpiece. As described above, applying this electrical current creates an electrical potential difference between the nanotool and the workpiece to cause an electron beam to emit from the nanotool and strike the conductive workpiece surface, evaporating material therefrom. The device of the present invention may further include a heater for heating at least a portion of the workpiece surface by localized heating, by radiative heating, by conductive heating, by resistive heating, or by any combination thereof.

The first support may be a leveling support for holding the conductive workpiece. The second support may be a nanopositioning stage for translation of the nanotool in nanometer increments. It will be appreciated that these features allow precise movement of the workpiece and nanotool relative to one another.

As described above, the localized heater may be a laser emitting a light beam having a wavelength of from about 0.3 $\mu$m to about 0.7 $\mu$m, and targeted to heat at least a portion of the workpiece surface. In cases when it is desirable to position the laser externally of the vessel of the present device, the vessel may include at least one port fabricated from a material substantially transparent to a laser beam, allowing the workpiece to be targeted by the laser without introducing the laser to the interior of the vessel. In such cases, the vessel may include at least one mirror surface in the interior chamber to redirect the laser beam to contact and heat at least a portion of the workpiece surface. As noted above, a masking grid fabricated of materials known in the art may be interposed between the point of origin of the laser beam and the workpiece surface, thereby partially preventing contact of the laser beam with the workpiece such that only the unmasked portion of the workpiece is heated. Of course, other means for heating the workpiece may be included, such as a heating element in a spaced orientation to the conductive workpiece (radiative heating) or in thermal contact with the workpiece (conductive heating), or an electrical current passed through the workpiece (resistive heating).

In still yet another aspect of the present invention, a nanotool for removing nanoscale quantities of material from a surface of an electrically conductive workpiece is provided, comprising at least one nanotube supported on an electrically conductive base and capable of emitting an electron beam in response to an electrical field applied to the conductive base. Thus, the nanotool will include at least one contact for receiving an electrical signal.

The nanotool may comprise a single nanotube supported on the base, or may comprise a plurality of substantially aligned nanotubes supported on the base. As noted above, the nanotool may comprise a plurality of substantially aligned nanotubes confined to one or more patterned regions of the conductive base. As also described above, any suitable nanotube may be used, such as a carbon nanotube, or a nanotube synthesized from tungsten, nickel, and the like. Both single- and multi-walled nanotubes may be utilized in fabricating the nanotool of the present invention. Typically, the nanotubes will have a diameter of from about 1 to about 100 nanometers. The conductive base may be fabricated from any suitably conductive metal or polymer as described above.

Other objects and applications of the present invention will become apparent to those skilled in this art from the following description wherein there is shown and described a preferred embodiment of this invention, simply by way of illustration of the modes currently best suited to carry out the invention. As it will be realized, the invention is capable of other different embodiments and its several details are capable of modification in various, obvious aspects all without departing from the invention. Accordingly, the drawings and descriptions will be regarded as illustrative in nature and not as restrictive.

BRIEF DESCRIPTION OF THE DRAWING

The accompanying drawing incorporated in and forming a part of the specification illustrates several aspects of the present invention and, together with the description, serves to explain the principles of the invention. In the drawing:

FIGS. 4a–4c illustrate alternative embodiments of a nanotool.

Reference will now be made in detail to the presently preferred embodiments of the invention, examples of which are illustrated in the accompanying drawing.

DETAILED DESCRIPTION OF THE INVENTION

In accordance with the necessities for nanoscale machining and the ability to transfer appropriate thermal energy to a workpiece by field emission from nanotubes, the methods and devices of the present invention employ a field emission of electrons from probes that consist of a single nanotube or multiple nanotubes as a tool for nanoscale machining. The machining process is conducted in a vacuum, so that machined atoms are conveyed away from the workpiece by the pressure gradient within the vacuum chamber.

The nanotool of the present invention comprises a field emitter comprising at least one carbon nanotube supported on a conductive substrate. In one embodiment, a single nanotube may be supported by a conductive probe, for example a conical conductive probe. In another embodiment, a regular array of nanotubes may be supported on a conductive substrate. In yet another embodiment, a patterned field of nanotubes, with the pattern corresponding to the pattern to be machined into the workpiece, may be supported over a conductive substrate. Nanomachining may be achieved by relative motion between the workpiece and nanotool to machine a pattern, or may result from the pattern of nanotubes employed without relative motion between workpiece and nanotool. Relative motion between the workpiece and the nanotool may be achieved by any of a number of means known in the art for moving an object in nanometer increments, such as by using nanopositioning stages employing piezo actuators and flexural bearings.

The nanotool may be supplemented with additional energy sources to reduce the amount of energy needed to remove material from the workpiece, thereby reducing the strain on the field emitting nanotool and increasing the life expectancy thereof. The supplemental energy may be supplied by any of a number of known means, such as resistive (Coulomb) heating within the workpiece, radiative heating from a separate heater proximal to the workpiece, conductive heating from a separate heater in thermal contact with the workpiece, or local heating, for example provided by a laser beam focused onto at least a portion of the workpiece.

EXAMPLE 1

In one aspect of the present invention, a device 10 for machining a nanometer-scale pattern on a surface of an electrically conductive workpiece is provided. The device of the invention, depicted schematically in FIG. 1, comprises a vessel 20 having a top 22, a bottom 24, and at least one side wall 26 defining an interior chamber 28. A vacuum pump 30 for applying a suitable vacuum is also included, in fluid communication with the interior chamber 28 via a hose 31. The interior chamber 28 holds an apparatus 32, comprising a frame 34 which supports a leveling support 36 for holding a conductive workpiece 38 and a nanopositioning stage 40 for holding a nanotool 42 in relative proximity to the conductive workpiece 38. The conductive workpiece 38 is held in place on the leveling support by holding chuck 37. The device 10 further includes an electrical source 44 for applying an electrical current to the nanotool 42 via a lead 41. The nanotool 42 comprises a conductive base 43 and at least one nanotube 45 supported thereby.

Figure 1:
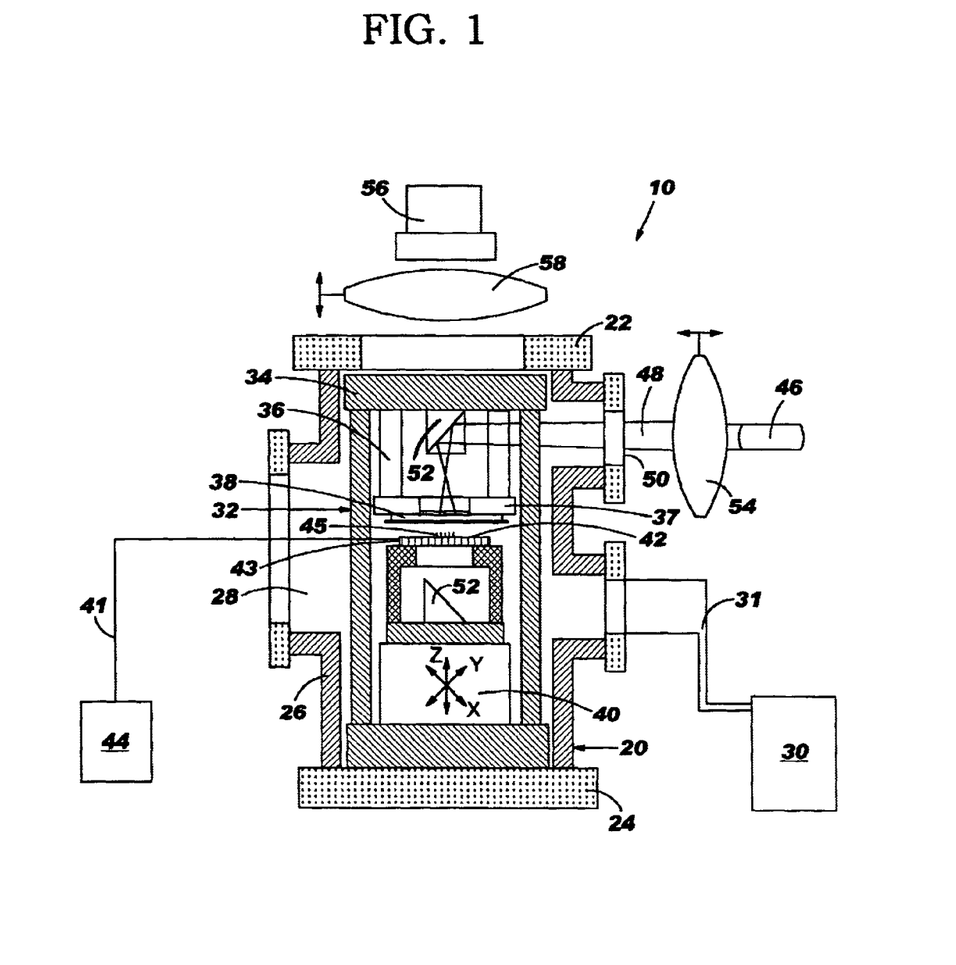
FIG. 1 schematically illustrates the device for nanomachining a conductive workpiece of the present invention.

The device of the present invention may further include a heater for heating at least a portion of the workpiece surface. As described above, the heater is a laser 46 emitting a light beam 48 having a wavelength of from about 0.3 $\mu$m to about 0.7 $\mu$m, and targeted to heat at least a portion of a surface of the workpiece 38. The laser may be positioned external to the vessel 20, whereby the light beam 48 passes through at least one port 50 fabricated from a material substantially transparent to the light beam 48. A mirror 52 redirects the light beam 48 to contact and heat at least a portion of the workpiece 38 surface. A focusing lens 54 is interposed between the laser 46 and port 50 to restrict the diameter of light beam 48 as desired. Optionally, a thermal imaging detector 56 and detector focusing lens 58 may be included to allow the user to monitor the progress of the nanomachining task.

Figure 2A:
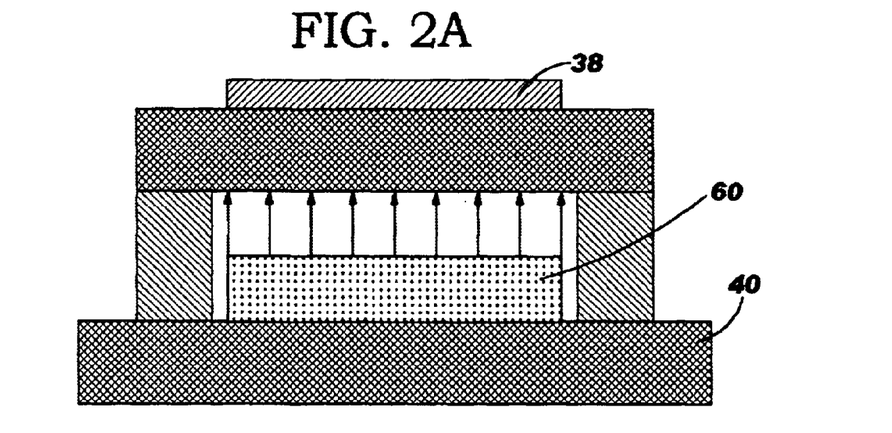
FIGS. 2a–2c schematially illustrate use of radiative heating (2a), conductive heating (2b), and resistive heating (2c) to excite a workpiece to a threshold energy.
Figure 2B:
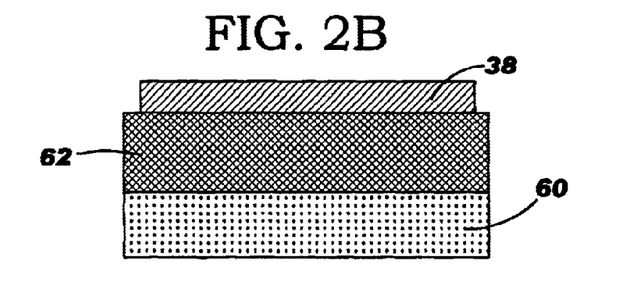
Figure 2C:
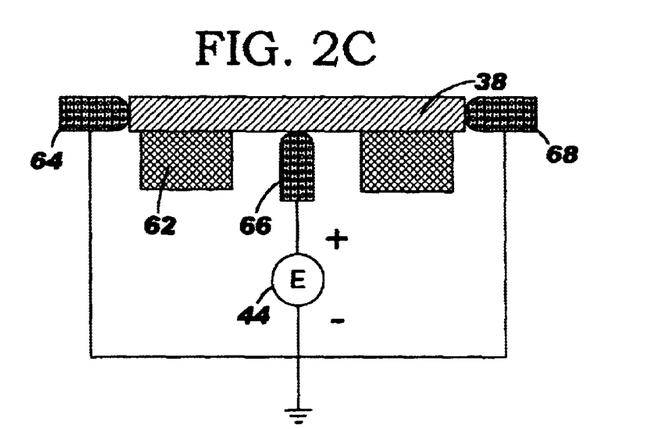

Other means for heating the workpiece may be included within the vessel 20. As shown schematically in FIG. 2a such means may include a heating element 60 in a spaced orientation to the conductive workpiece 38 (radiative heating). The heating element 60 may also be in thermal contact with the workpiece 38 (conductive heating), such as through a holding chuck 62 as shown in FIG. 2b. In yet another embodiment, the electrical current provided by electrical source 44 (FIG. 1) may also provide resistive heating as it passes through the workpiece 38. An example of this configuration is shown schematically in FIG. 2c, wherein contacts 64, 66, 68 supply current to the workpiece 38 from electrical source 44.

EXAMPLE 2

Figure 3A:
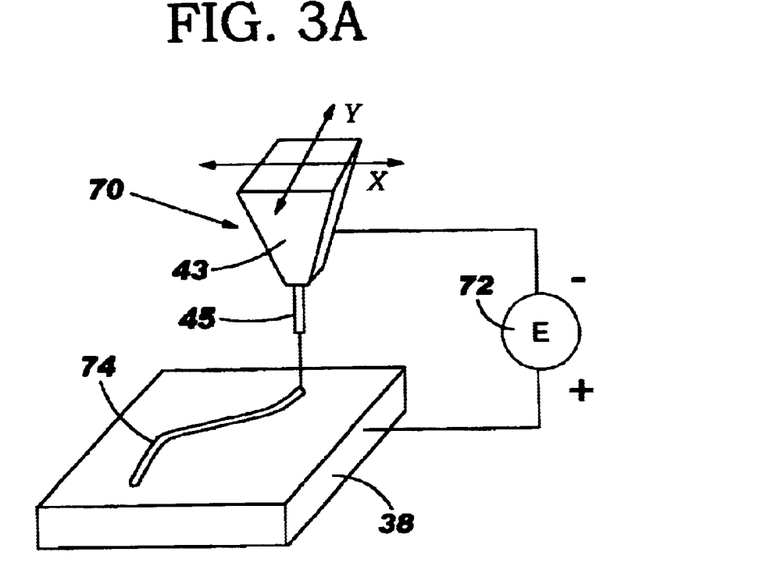
FIGS. 3a–3b schematically illustrate a pattern nanomachined in a conductive workpiece by movement of a nanotool (3a) or of the workpiece (3b)
Figure 3B:
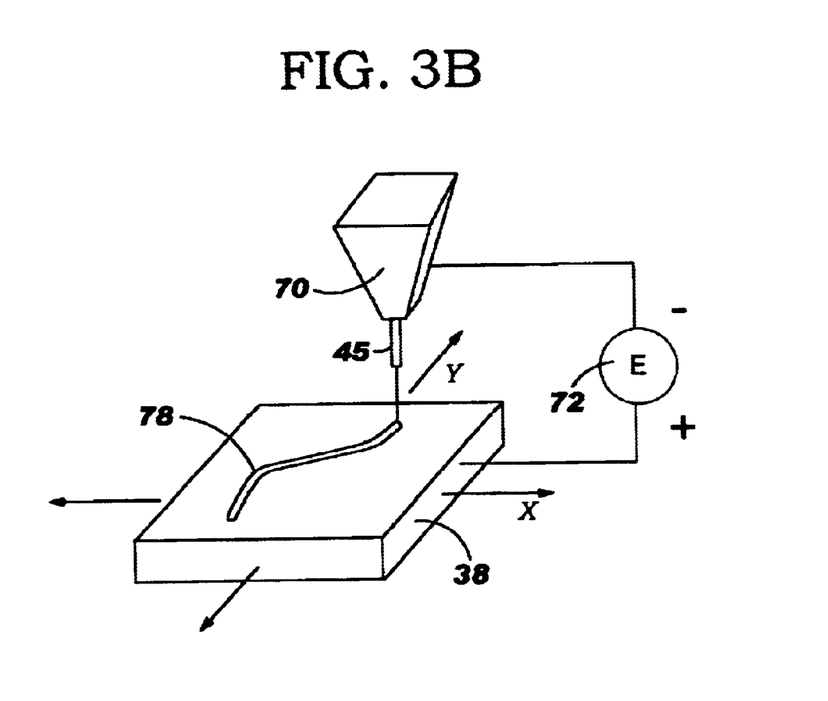
Figure 5:
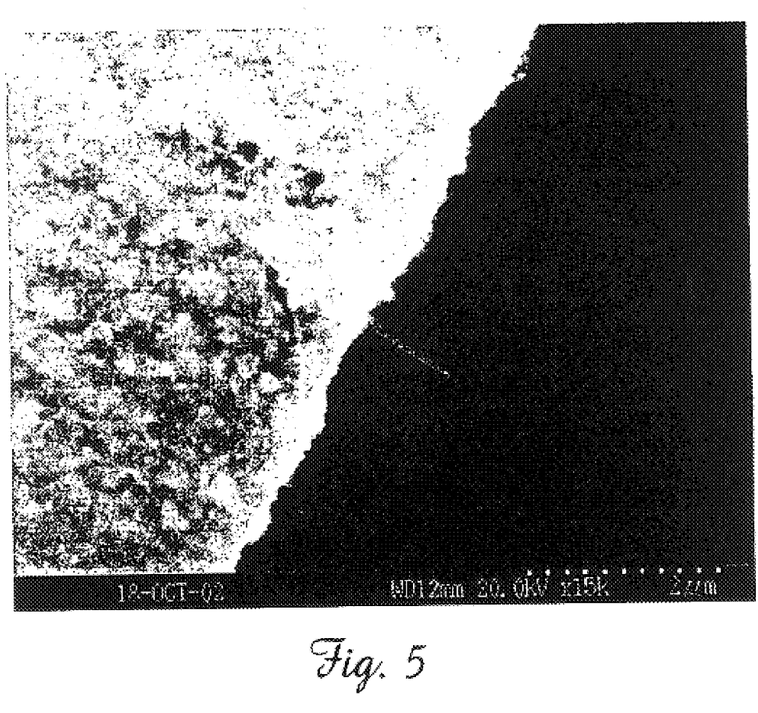
FIG. 5 is a micrograph showing a single nanotube supported on an electrochemically etched tungsten probe.

Nanotools for removing nanoscale quantities of material from a surface of an electrically conductive workpiece 38 are shown schematically in FIGS. 3a–3c. The nanotool 70 comprises at least one nanotube 45 supported on an electrically conductive conical base 43 and includes at least one contact 72 for receiving an electrical signal. FIG. 3a illustrates the nanotool 70 supported by a nanopositioning stage (not shown) for translating the nanotool 70 relative to a workpiece 38 to nanomachine a pattern 74 in the workpiece 38. FIG. 3b illustrates a workpiece 38 supported by a nanopositioning stage (not shown) for translating the workpiece 38 relative to the nanotool 70 to nanomachine a pattern 78 in the workpiece 38. A micrograph showing a single nanotube supported by an electrochemically etched tungsten probe si shown in FIG. 5.

EXAMPLE 3

Figure 4A:
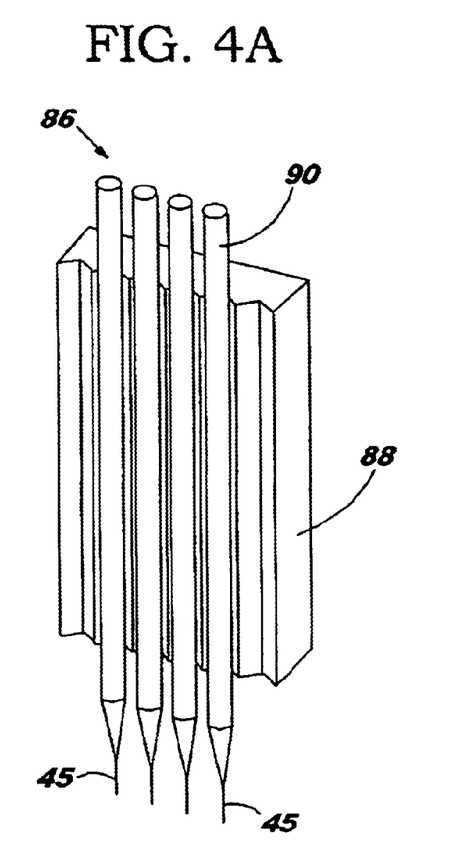
FIG. 4a shows a nanotool comprising a spaced array of electrochemically sharpened tungsten wires supported by a silicon ferrule, each sharpened wire tip having a nanotube attached thereto.

FIG. 4a illustrates an alternative embodiment of a nanotool 80. The nanotool 80 comprises a silicon ferrule 82 for supporting a spaced array of electrochemically sharpened tungsten wires 84 which serve as conductive bases. The sharpened wires 84 support individual nanotubes 45.

EXAMPLE 4

Figure 4B:
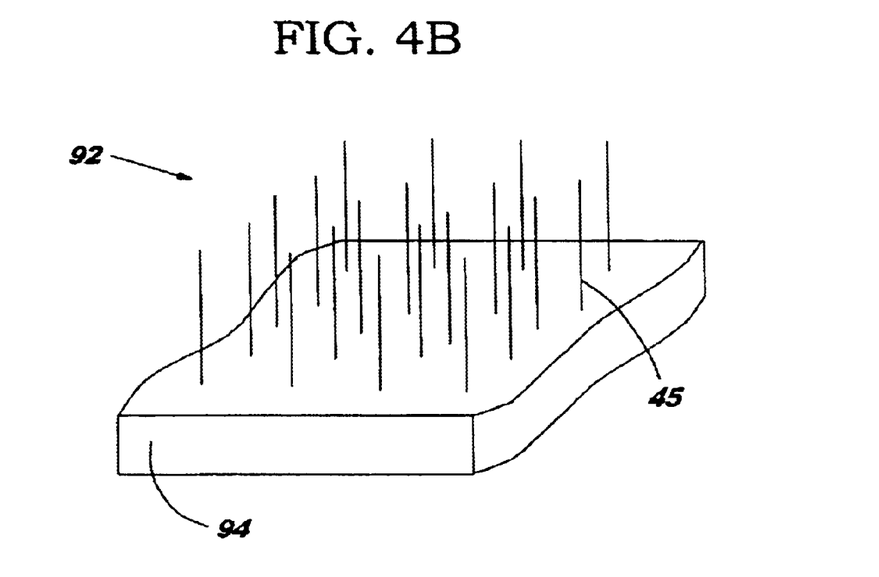
FIG. 4b shows a nanotool comprising a forest of substantially aligned nanotubes attached to a conductive base.

Nanotools 86, 88 for removing nanoscale quantities of material from a surface of an electrically conductive workpiece 38 are shown schematically in FIGS. 4a and 4b. The nanotools 86, 88 comprise a plurality of nanotubes 45 supported on an electrically conductive, substantially planar base 90. FIG. 4b demonstrates a nanotool 88 substantially as shown in FIG. 4a, wherein the nanotubes 45 are confined to predetermined regions of the base 90 to form a desired pattern. It will be appreciated these this nanotool configurations allow the user to nanomachine a pattern into a workpiece 38 without the need for moving either workpiece 38 or nanotool 86, 88 relative to one another.

In another aspect, as described above the present invention provides a method for machining a nanometer-scale pattern on a surface of an electrically conductive workpiece, comprising the steps of placing a nanotool in substantial proximity to the conductive workpiece surface, creating an electrical potential difference between the nanotool and the workpiece surface to cause an electron beam to emit from the nanotool and strike the conductive workpiece surface, resulting in evaporation of nanoscale quantities of material from the workpiece surface, and applying a vacuum to remove evaporated material from the workpiece surface.

To achieve nanoscale machining of a workpiece, which is the removal of material near the atomic scale (1 nm–100 nm), energy must be concentrated spatially with nearly atomic resolution and also sufficient to break bonds in crystal lattices, to allow atoms or clusters of atoms arranged within the crystal lattice to be removed. If the energy is too excessive, then nearby atoms will also be effected and nanoscale resolution cannot be attained. Therefore, to achieve nanoscale machining, energy should be within specific limits and spatially controlled to attain patterns. This invention employs electron beams emitted from carbon nanotubes as a source of energy with nanoscale resolution and manufactures patterns by either patterning the nanotubes or relative motion between the workpiece and nanotubes.

An estimate of the minimum necessary energy for removing atoms or clusters of atoms may be obtained by considering the fundamental thermodynamics of removing atoms from a workpiece surface (Taniguchi, N. et al., *Energy-Beam Processing of Materials*. Oxford University Press. New York. 1989, incorporated herein by reference). The internal energy, $U$, of an atom in a solid's crystal lattice is the sum of the Gibbs free energy, $G$, thermal energy, $H$, kinetic energy, $E_k$, and elastic strain energy, $E_e$.

The Helmholtz free energy, $F$, is the sum of the Gibbs energy, $G$, and the elastic energy, $E_e$. $F$ varies with the displacement, $x$, of the atom away from its equilibrium position in the crystal lattice. The Gibbs free energy is the energy of the atom when $x$ and $E_e$ are zero, and therefore corresponds to the minimum Helmholtz free energy of the atom at its lattice site.

Figure 4C:
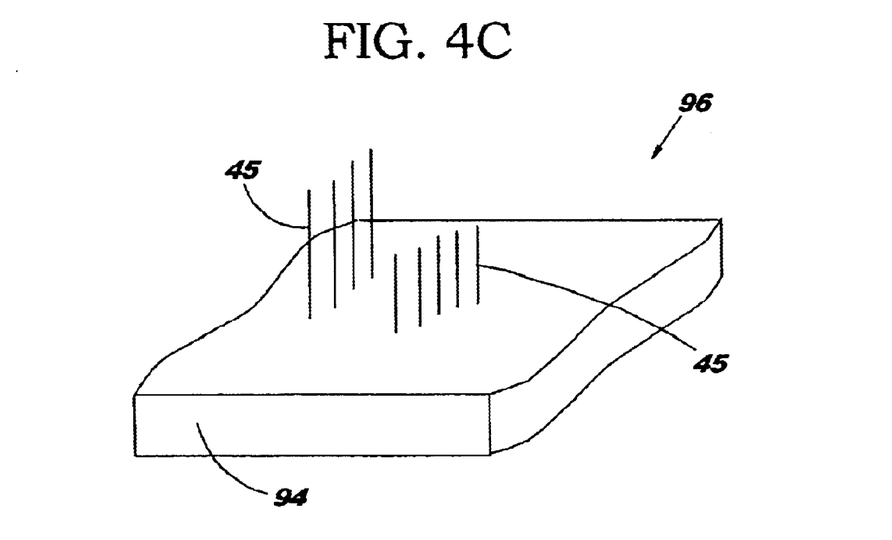
FIG. 4c shows a nanotool comprising substantially aligned nanotubes supported on a conductive base, with the nanotubes confined to specific patterns on the base to form a defined pattern.

To remove material at the atomic scale, atoms must be displaced from their equilibrium lattice position and extracted from the surface of the workpiece. The energy of the atom must be increased until it exceeds the Helmholtz free energy at the surface ($G+E_b$), by the surface barrier energy, $E_s$, ($E_b$ is lattice bonding energy) as illustrated by a dashed line in FIG. 4. Therefore, the minimum energy for breaking the atom out of the crystal lattice is the sum of $E_s$ and $E_b$. The Threshold Specific Processing Energy (TSPE), $\delta$, is the energy density (J/m$^3$) necessary for removing material. Although energy depends upon pulse duration and size, a reasonable estimate is given for the density in by the equation $\delta=(E_b+E_s) N_A/v$ [J/m$^3$], where e=TSPE for Atomic Material Removal (J/atom), $E_b$=Lattice Bonding Energy, [J/atom], $E_s$=Surface Barrier Energy, [J/atom], $N_A$=Avogadros' number=6.022×10$^{23}$ [atoms/mol], and v=Molar Volume of Workpiece Material [m$^3$/mol].

Using the method and device of this invention, material is removed at length scales between 1 nm and 100 nm. Based on the above calculations, a TSPE on the order of 10$^3$ to 10$^5$ MJ/m$^3$ is necessary for processing at the atomic scale. As an example, the lattice bonding energy for Fe is about $E_b$=1.6× 10$^{-20}$ J/atom. The surface barrier energy is of comparable magnitude and is known to be about 6.9×10$^{-20}$ J/atom for iron in helium. In addition, some surplus energy is necessary for pulling the atom from the surface; this is easier within a high vacuum but still requires about 1.6×10$^{-20}$ J/atom. The total energy necessary for removing a single Fe atom in a vacuum is therefore about 1.1×10$^{-19}$ J/atom, which is conservatively just less than 10 eV per atom. In the present invention, the TSPE for nanoscale machining (<10 eV) is delivered to the surface of the workpiece by electron field emission from at least one nanotube.

Zhu et al. (Zhu, W., C. et al., "Large Current Density from Carbon Nanotube Field Emitters". *Applied Physics Letters*. V. 75, N. 6. Aug. 9, 1999. p. 873–875, incorporated herein by reference) reported the emission current measured as a function of applied voltage and gap distance between a nanotube-based field emitter and a Mo anode (10 µm–300 µm). The field emitter of Zhu et al. produced a current of 0.4 mA at 3 kV and 0.7 mA at 4 kV. Table 1 summarizes the range of power input to the emitter reported by Zhu et al. This table demonstrates that the range of power depends upon the emission conditions and varied between 1 mW and 2.8 W. Furthermore, the steady-state heat transferred into the Mo anode matches the electrical power input to the system at the 4 kV emission condition. This suggests that the cumulative heat transmitted to the Mo anode by field emission was approximately 2.8 W. In this case, it is likely that entire field emission was dominated by one or two CNTs. Therefore, the heat transferred to the Mo anode is about 0.5 W per CNT Table 1

| | Power Transmitted from SWNT Emitter to Mo Anode | | | | |
|---|---|---|---|---|---|
| Point | Distance | Field | Voltage | Current | Power |
| 1 | ~13 µm | 19 V/µm | 250 V | 5 µA | 1 mW |
| 2 | ~50 µm | 20 V/µm | 1000 V | 60 µA | 60 mW |
| 3 | ~135 µm | 14 V/µm | 1900 V | 100 µA | 190 mW |
| 4 | ~50 µm | 60 V/µm | 3000 V | 400 µA | 1.2 W |
| 5 | Not Reported | Not Reported | 4000 V | 700 µA | 2.8 W |

We have shown (Wong et al., "Modeling of Energy Transfer in Field Emission of Carbon Nanotubes," presented at the 8th AIAA/ASME Joint Thermophysics and Heat Transfer Conference, St. Louis, Mo., 2002, incorporated herein by reference) that if electron energy emitted by a single CNT is about 0.5 W, that the temperature of a volume of 40 nm diameter and 50 nm deep in a thin gold film heats above its melting temperature within about 1 msec.

The electric field potential established to cause the electron beam to emit from the nanotool will typically be at least 1 V/µm. The nanotool may comprise at least one nanotube supported on an electrically conductive base whereby the beam will strike the workpiece at the desired site. As described above, the nanotool may comprise a single nanotube supported by an electrically conductive base, or may comprise a plurality of substantially aligned nanotubes supported on the base. The plurality of nanotubes may be confined to one or more patterned regions of the electrically conductive base. It will be appreciated that for many applications this feature obviates the need to move either workpiece or nanotool relative to one another to machine the corresponding pattern into the workpiece.

Nanotubes suitable for the present invention include carbon nanotubes. However, it will be appreciated that any substance capable of forming a nanotube for emitting an electron beam in response to an electrical field may be used, such as tungsten, nickel, and the like. The nanotubes of the present invention may be single-walled or multi-walled nanotubes, and typically have a diameter of from about 1 to about 100 nanometers.

The nanotool conductive base may be fabricated from any suitably electrically conductive metal or polymer, including but not limited to materials selected from the group consisting of silicon nitride, titanium nitride, tungsten carbide, tantalum nitride, porous silicon, nickel, cobalt, gold, aluminum, polycrystalline diamond, and any combination thereof.

Numerous means for attaching a nanotube to a conductive base as described herein are known in the art, and suitable for fabricating the nanotool of the present invention. For example, the nanotubes may be grown in situ on the conductive base by the steps of: (a) depositing a suitable catalyst particle on the conductive substrate, and (b) exposing the catalyst particle to a carbon-containing gas at a temperature sufficient to cause one or more carbon nanotubes to grow or self-assemble from the catalyst particle in a substantially perpendicular orientation to the substrate. The carbon nanotubes may also be grown in situ from suitable catalyst particles deposited only on selected patterned regions of the conductive substrate. Examples of methods for fabricating microscale patterns of vertically aligned carbon nanotubes for use as field emitters are disclosed in the following publications, all of which are incorporated herein by reference: Collins and Zettl, "A Simple and Robust Electron Beam Source from Carbon Nanotubes", *Applied Physics Letters*, Vol. 69, Sep. 23, 1996, pp. 1969–71; Wang et al., "A Nanotube-based Field Emission Flat Panel Display", *Applied Physics Letters*, Vol. 72, Jun. 1, 1998, pp. 2912–13; Choi et al., "Patterned Growth and Field Emission Properties of Vertically Aligned Carbon Nanotubes", *Diamond and Related Materials*, Vol. 10, 2001, pp. 1457–64; Huang et al., "Patterned Growth and Contact Transfer of Well-aligned Carbon Nanotube Films, *J. Phys. Chem.*, Vol. 103, 1999, pp. 4223–27.

It is also known to attach nanotubes to a conductive base using arc discharge to "spot-weld" the nanotube in place, and to grow panels of aligned carbon nanotubes at relatively low temperatures by plasma-enhanced hot filament chemical vapor deposition, using iron nanoparticle catalysts deposited on nickel-coated glass (Stevens et al., "Carbon nanotubes as probes for atomic force microscopy", Nanotechnology Vol. 11, pp. 1–5, 2000; Ren et al., "Synthesis of Large Arrays of Well-Aligned Carbon Nanotubes on Glass, Science, Vol. 282, pp. 1105–1107; both incorporated by reference). These latter methods may also be used to fabricate the nanotool of the present invention.

EXAMPLE 5

A nanomachining device, substantially as described in Example 1, is constructed using a tungsten wire conductive base. A pattern of Fe nanoparticles is deposited on the substrate to catalyze the growth of aligned multi-walled nanotubes thereon, wherein the nanotube growth is controlled to provide a diameter of substantially 50 nm. The process for in situ growth of multi-walled nanotubes of controlled diameter and length is described in Andrews et al., *Chemical Physical Letters*, Vol. 303, 1999, pp. 467–474, incorporated by reference. The nanotool is placed on a nanopositioning stage employing piezo actuators and flexural bearings.

A workpiece, comprising a thin film (5 microns) of gold deposited on a single-crystal quartz base is placed on the leveling support, and held in place using a holding chuck. The nanotool is placed in proximity to the desired locus to be machined using the nanopositioning stage, and a vacuum of $10^{-5}$ Torr is applied to the nanomachining device. An argon laser is targeted to the site to be machined (passing through the crystal quartz base to strike the surface of the gold workpiece obverse to the surface being nanomachined), and heats only the surface of the workpiece immediately contiguous to the locus to be machined to provide a threshold energy (just below the melting temperature of gold, i.e. $T_m$=1336 K). A electrical potential of 1 kV is applied to the nanotool, thereby creating an electrical field of 1 V/$\mu$m between the nanotool and workpiece, and an electron beam penetrating to a depth of 1 nm (approximately 5 atoms depth evaporation). The nanotool is moved to generate the desired pattern, substantially as depicted schematically in FIG. 3a.

The foregoing description of a preferred embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method for machining a nanometer-scale pattern on a surface of an electrically conductive workpiece, comprising the steps of:

a) placing a nanotool in substantial proximity to said conductive workpiece surface, said nanotool comprising at least one nanotube supported on an electrically conductive base;

b) creating an electrical potential difference between said nanotool and said workpiece to cause an electron beam to emit from the nanotool, striking the conductive workpiece surface and evaporating material from said conductive workpiece surface; and c) applying a vacuum to said workpiece and said nanotube to remove said evaporated material from said workpiece surface.

2. The method of claim 1, including the step of exciting said workpiece to a threshold energy prior to contacting said workpiece with said electron beam.

3. The method of claim 1, wherein said workpiece or said nanotool are moved relative to one another to remove material from the workpiece in the desired pattern.

4. The method of claim 1, wherein said electric field potential is at least 1 V/$\mu$m.

5. The method of claim 1, wherein said conductive workpiece is fabricated from a metal or a conductive polymer.

6. The method of claim 5, wherein said conductive workpiece is fabricated from materials selected from the group consisting of aluminum, copper, silver, gold, polymethylmethacrylate, and any combination thereof.

7. The method of claim 1, wherein said nanotool includes a plurality of substantially aligned nanotubes supported on said electrically conductive base.

8. The method of claim 7, wherein said plurality of nanotubes are confined to one or more patterned regions of said electrically conductive base.

9. The method of claim 1, wherein said nanotube is a carbon nanotube.

10. The method of claim 9, wherein said carbon nanotube is a single-walled carbon nanotube.

11. The method of claim 9, wherein said carbon nanotube is a multi-walled carbon nanotube.

12. The method of claim 1, wherein said nanotube has a diameter of from about 1 to about 100 nanometers.

13. The method of claim 1, wherein said conductive base is fabricated from an electrically conductive metal or polymer.

14. The method of claim 13, wherein said conductive base is fabricated from materials selected from the group consisting of silicon nitride, titanium nitride, tungsten carbide, tantalum nitride, porous silicon, nickel, cobalt, gold, aluminum, polycrystalline diamond, and any combination thereof.

15. The method of claim 1, wherein said workpiece is deposited as a thin film on a substrate.

16. The method of claim 15, wherein said thin film has a depth of up to 5 microns.

17. The method of claim 15, wherein said substrate is fabricated from a material substantially transparent to a laser beam.

18. The method of claim 17, wherein said substrate is fabricated from materials selected from the group consisting of single-crystal quartz, amorphous quartz, silicon, and any combination thereof.

19. The method of claim 2, wherein said workpiece is excited to said threshold energy by heating.

20. The method of claim 19, wherein said workpiece is heated by localized heating, by radiative heating, by conductive heating, by resistive heating, or any combination thereof.

21. The method of claim 20, wherein said localized heating is provided by targeting a laser beam to an area substantially corresponding to the pattern to be machined.

22. The method of claim 21, wherein said targeting is achieved by masking said workpiece such that only an area corresponding to the desired pattern to be machined is exposed to the laser beam.

23. The method of claim 21, wherein said laser is a continuous wave laser providing a light beam having a wavelength of from about 0.3 $\mu$m to about 0.7 $\mu$m.

24. The method of claim 1, wherein a vacuum of up to $10^{-5}$ torr is applied to said nanotool and said workpiece.

25. The method of claim 1, wherein an electrical potential of from about 500 V to about 5 kV is applied to said nanotool.

26. A device for machining a nanometer-scale pattern on a surface of an electrically conductive workpiece, comprising:
 a) a vessel having an interior chamber to which a vacuum may be applied;
 b) in said interior chamber, an apparatus comprising
  a first support for holding a conductive workpiece;
  a second support for holding a nanotool in relative proximity to said conductive workpiece, said nanotool comprising at least one nanotube supported on an electrically conductive base; and
 c) an electrical source for applying an electrical current to said nanotool to create an electrical potential difference between the nanotool and the workpiece to cause an electron beam to emit from the nanotool and strike said conductive workpiece surface.

27. The device of claim 26, further including a heater for heating at least a portion of said workpiece surface.

28. The device of claim 26, wherein said interior chamber is capable of sustaining a vacuum of up to $10^{-5}$ torr.

29. The device of claim 26, wherein said vessel includes at least one port fabricated from a material substantially transparent to a laser beam.

30. The device of claim 26, wherein said first support is a leveling support for holding said conductive workpiece.

31. The device of claim 26, wherein said second support is a nanopositioning stage for translation of said nanotool in nanometer increments.

32. The device of claim 27, wherein said heater heats said workpiece surface by localized heating, by radiative heating, by conductive heating, by resistive heating, or any combination thereof.

33. The device of claim 32, wherein said localized heater is a laser emitting a light beam targeted to heat at least a portion of the workpiece surface.

34. The device of claim 33, further including a masking grid interposed between a point of origin of said laser beam and the workpiece surface, said masking grid partially preventing contact of the laser beam with the workpiece such that only the unmasked portion of the workpiece is heated.

35. The device of claim 33, wherein the laser is placed near an exterior of said vessel such that the laser beam passes through said port to heat at least a portion of the workpiece surface.

36. The device of claim 35, further including at least one mirror surface in the interior chamber to redirect the laser beam to contact and heat at least a portion of the workpiece surface.

37. The device of claim 33, wherein said laser is a continuous wave laser providing a light beam having a wavelength of from about 0.3 $\mu$m to about 0.7 $\mu$m.

38. The device of claim 32, wherein said radiative heater is a heating element in a spaced orientation to said conductive workpiece.

39. The device of claim 32, wherein said resistive heater comprises an electrical current passed through said conductive workpiece.

40. The device of claim 32, wherein said conductive heater is a heating element in substantial thermal contact with said conductive workpiece.

41. The device of claim 26, wherein said electrical source creates an electrical potential difference of at least 1 V/$\mu$m between said nanotool and said workpiece.

42. A nanotool for removing nanoscale quantities of material from a surface of an electrically conductive workpiece, comprising:
 at least one nanotube supported on an electrically conductive base and capable of emitting an electron beam in response to an electrical field applied to said conductive base; and
 at least one contact for receiving an electrical signal.

43. The nanotool of claim 42, comprising a plurality of substantially aligned nanotubes supported on a conductive base.

44. The nanotool of claim 43, comprising a plurality of substantially aligned nanotubes confined to one or more patterned regions of said conductive base.

45. The nanotool of claim 42, wherein said nanotube is a carbon nanotube.

46. The nanotool of claim 45, wherein said carbon nanotube is a single-walled carbon nanotube.

47. The nanotool of claim 45, wherein said carbon nanotube is a multi-walled carbon nanotube.

48. The nanotool of claim 42, wherein said nanotube has a diameter of from about 1 to about 100 nanometers.

49. The nanotool of claim 42, wherein said conductive base is fabricated from an electrically conductive metal or polymer.

50. The nanotool of claim 49, wherein said conductive base is fabricated from materials selected from the group consisting of silicon nitride, titanium nitride, tungsten carbide, tantalum nitride, porous silicon, nickel, cobalt, gold, aluminum, polycrystalline diamond, and any combination thereof.

* * * * *